United States Patent [19]

Ogawa et al.

[11] 3,719,863

[45] March 6, 1973

[54] LIGHT SENSITIVE THYRISTOR

[75] Inventors: Takuzo Ogawa; Masao Iimura, both of Hitachi, Japan

[73] Assignee: Hitachi, Ltd., Tokyo, Japan

[22] Filed: Nov. 8, 1971

[21] Appl. No.: 196,292

Related U.S. Application Data

[63] Continuation-in-part of Ser. No. 816,527, April 16, 1969, abandoned.

[30] Foreign Application Priority Data

April 17, 1968 Japan ....................43/25207

[52] U.S. Cl.......317/235 R, 317/235 N, 317/235 AB, 317/234 G

[51] Int. Cl. ....................H01l 15/00

[58] Field of Search....................317/235 AB, 235 N

[56] References Cited

UNITED STATES PATENTS

| | | | |
|---|---|---|---|
| 3,328,651 | 10/1963 | Miller | 317/235 |
| 3,196,285 | 7/1965 | Hubner | 307/88.5 |
| 3,539,803 | 11/1970 | Beerman | 250/83.3 |
| 3,458,779 | 7/1969 | Blank | 317/234 |

OTHER PUBLICATIONS

G. E. Transistor Manual, 1964, Ch. 16, "Silicon Controlled Switches," pages 392–393.

*Primary Examiner*—Martin H. Edlow
*Attorney*—Craig, Antonelli & Hill

[57] ABSTRACT

A high light-sensitive thyristor, wherein two external regions and two internal regions have opposite conductivity types and lie adjacently to each other, the edges of the three PN junctions being formed thereby extend to one plane surface, the area of the external emitter region at the plane surface to be illuminated being, 10 – 25 percent of the total of the areas of the first base region outside said external region and of the second base region outside said first region.

10 Claims, 15 Drawing Figures

INVENTORS

TAKUZO OGAWA, MASAO IIMURA

BY Craig, Antonelli & Hill
ATTORNEYS

INVENTORS

TAKUZO OGAWA, MASAO IIMURA

BY Craig, Antonelli & Hill
ATTORNEYS

INVENTORS

TAKUZO OGAWA, MASAO IIMURA

BY Craig, Antonelli & Hill
ATTORNEYS

INVENTORS
TAKUZO OGAWA, MASAO IIMURA
BY Craig, Antonelli & Hill
ATTORNEYS

LIGHT SENSITIVE THYRISTOR

CROSS-REFERENCE TO RELATED APPLICATION

This application is a continuation-in-part of U.S. Ser. No. 816,527 filed on Apr. 16, 1969, and now abandoned.

BACKGROUND OF THE INVENTION

1. Field of the Invention

This invention relates to a light-sensitive thyristor having a high operational stability and high light-sensitivity.

2. Description of the Prior Art

While the ordinary thyristor is operated by an electric gate signal, the light-sensitive thyristor of the present invention is operated by a light signal. In order to switch the thyristor from a blocking state to an on-state, the current transport efficiency of the thyristor must satisfy some conditions. In a conventional PNPN type light-sensitive thyristor, three PN junctions are formed by two external regions (P type and N type) and two internal regions (N type and P type), the regions constituting a P emitter ($P_E$), an N emitter ($N_E$), an N base ($N_B$) and a P base ($P_B$). A cathode, an anode and a gate are connected in ohmic contact to $N_E$, $P_E$ and $P_B$, respectively. The current transport efficiencies $\alpha_1$ and $\alpha_2$ of the transistors, when the thyristor is considered to consist of two NPN and PNP type transistors, increase with an increase in the current in the forward blocking state. Thus, if the current is increased the condition $\alpha_1 + \alpha_2 \rightarrow 1$ becomes satisfied and the "on" state is realized.

When light is projected onto silicon, light is absorbed by the silicon to produce current carriers (hole-electron pair). The wavelength of light having this effect is below about 11,000 A. Though it becomes easier to generate current carriers as the wavelength decreases (light energy increases), the light absorption rate of silicon increases as the wavelength decreases. Thus, the current carrier is hardly generated at the deep part below the surface of silicon.

When the thyristor is irradiated with light effective to operate the thyristor in the forward blocking state, an electric current (photo-current) flows. As the light intensity increases and the photo-current increases, $\alpha_1$ and $\alpha_2$ become large and when $\alpha_1 + \alpha_2 \rightarrow 1$, it becomes "on" ignited. However, it is not always possible to induce said phenomenon easily in all thyristors, but some of the current carriers generated by the light irradiation recombine and disappear before they reach the central junction $J_2$ (formed by $P_B$ and $N_B$). Thus, they do not contribute to photo-current. In particular, almost all the current carriers generated near the surface cannot reach the junction $J_2$. Accordingly, if the thyristor is not designed and fabricated so that the photocurrent may flow efficiently, the thyristor cannot be operated by light effectively.

In order to produce the photo-current efficiently, the following expedients are resorted to.

(1) Screen materials or absorptive materials are not provided at the surface to allow light to penetrate into silicon. The surface is so treated as not to scatter light.

(2) To make light absorbed near the junction $J_2$, the depth of the junction $J_2$ is made small. However, if the junction $J_2$ is made too shallow, the emitter injection efficiency decreases. Thus, mainly, the distance between the junction $J_3$ (formed by $N_E$ and $P_B$) and the junction $J_2$ is made small.

(3) Means are provided to make the lifetime of the current carriers (minority carriers) long.

The light-sensitive thyristor must be fabricated so that said requirements (1), (2) and (3) may be satisfied. Since the edge of the junction is exposed at the side surface of the silicon block in a conventional light-sensitive thyristor, all the surfaces of the silicon block are coated with resin etc. for surface protection after fabrication. Accordingly, the penetration of light is prevented and the difference of the coatings from thyristor to thyristor results in unevenness of their characteristics. Though the light-sensitive thyristor has a gate on the $P_B$ region, it is not for gate ignition, but for changing the characteristics of the thyristor including the breakover voltage etc. by connecting said gate and the cathode through the resistor $R_{gk}$. Since the position at which the gate lead is set is not precisely determined in a conventional light-sensitive thyristor, it becomes one of the causes for the variance of the characteristics.

Since conventional light-sensitive thyristors are fabricated so as to satisfy said requirements (2) and (3), $\alpha_2$ is particularly large and $\alpha_1 + \alpha_2$ are large. However, some defects also appear. Namely, when a voltage at a rise rate of $dv/dt$ is applied to a junction the capacitance of which is $C_j$, an electric current $C_j\, dv/dt$ flows, but if the condition $\alpha_1 + \alpha_2 = 1$ is realized by said current, the thyristor becomes ignited. Thus, the method of applying a voltage is limited and it becomes difficult to use the thyristor except cases of small $dv/dt$. In other words, since the light-sensitivity and the $dv/dt$ characteristics are factors contradictory to each other, illumination for ignition cannot be made so small.

SUMMARY OF THE INVENTION

An object of this invention is to provide a light-sensitive thyristor having a high light-sensitivity.

Another object of this invention is to provide a light-sensitive thyristor having a good operational stability.

A further object of the invention is to provide a light-sensitive thyristor having a short turn-on time.

A yet further object of the invention is to provide a light-sensitive thyristor having a relatively small forward voltage drop in the on-state without deteriorating the breakdown characteristics in spite of a high light-sensitivity.

A further object of the invention is to provide a light-sensitive thyristor which is accompanied by very small variance of the electrical characteristics such as a turn-on time etc.

Other objects, features and advantages of this invention will become more apparent from the following detailed description of the invention when taken in conjunction with the accompanying drawings.

The object and advantage of this invention are achieved by a light-sensitive thyristor wherein the edge of a PN junction contributing to light-sensitivity is exposed at a light receiving surface and the edge is covered with a passivation film such as a silicon oxide film. Namely, this invention is based on the discovery of the fact that the PN junction formed by the two internal regions having a much higher light-sensitivity than that formed by the external regions at the side irradiated by light and the adjacent internal region.

DESCRIPTION OF THE PREFERRED EMBODIMENTS

Figure 1:
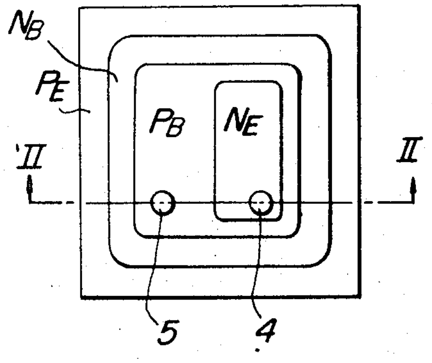
FIG. 1 is a plan view showing a structure of the light-sensitive thyristor according to this invention.
Figure 2:
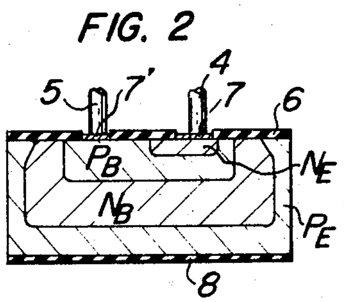
FIG. 2 is a cross-sectional diagram taken along line II—II in FIG. 1.

FIG. 1 and FIG. 2 show a structure of the light-sensitive thyristor according to an embodiment of this invention. The edge of each PN junction in the silicon block consisting of four layers $P_E$, $N_B$, $P_B$ and $N_E$ extends to one plane surface. A cathode 4, a gate 5 and an anode 8 are in ohmic contact to $N_E$, $P_B$, and $P_E$, respectively, through the evaporation films 7, 7' of Au, Al. etc. The upper surface of the silicon block is covered with a silicon oxide film 6. The silicon oxide film is formed at and near the edges of the PN junctions and functions to isolate the edges of the PN junctions from the outer atmosphere to stabilize the electric characteristics thereof and at the same time functions as a film for preventing light reflection at the upper irradiated surface of the silicon block. The reflectivity of light can be reduced from 30 percent to 5 percent by forming the silicon oxide film in comparison with the case of no oxide film. The conditions of reflection maxima and minima when a single layer of film is used are as follows.

$$\text{minimum } nd = \lambda/4\,(2m+1),\ (m=0, 1, 2, 3,) \quad (1)$$

$$\text{maximum } nd = \lambda/4\,(2m),\ (m=1, 2, 3,) \quad (2)$$

where

*n*: refractive index of film, which is 1.5 for a $SiO_2$ film

*d*: thickness of film

λ: light wavelength (Light-sensitive thyristor has a peak of sensitivity at about 10,000 A.)

Particularly, when $n = \sqrt{n_g}$, the reflectivity is 0, where $n_g$ is the refractive index of silicon and is 3.42 for 10,000 A. When (1) is satisfied, minimum occurs and in case of (2) maximum occurs. Thus, it will be understood that the reflectivity would be 0 if the silicon oxide film had a refractive index $\sqrt{n_g} = \sqrt{3.42} = 1.85$. Accordingly, it is impossible to make the refectivity 0 only with the $SiO_2$ film. The term "silicon oxide" film used in this invention means not only a pure $SiO_2$ film, but also phosphorus glass films etc. which are substantially transparent to the light used as an ignition signal.

When $n = 1.5$ and $\lambda = 10{,}000$ Å, the relation between the reflectivity and the film thickness is as shown in the following table

| | Film thickness (μ) | | | | | | | | | |
|---|---|---|---|---|---|---|---|---|---|---|
| Reflection minimum | 0.17 | | 0.50 | | 0.83 | | 1.1 | | 1.50 | |
| Reflection maximum | | 0.33 | | 0.66 | | 1.0 | | 1.33 | | 1.66 |

Accordingly, the film thickness near 0.83 μ, 1.1 μ and 1.5 μ is suitable for the silicon oxide film. When the oxide film is too thin, the stabilization effect of the PN junction becomes insufficient or some inconvenience appears in fabrication. On the other hand, when the oxide film is too thick, cracks occur in the oxide film due to the difference in the thermal expansion coefficient of silicon and silicon oxide film and the film does not function effectively to protect the PN junction. As the silicon oxide film, either the film used as an impurity diffusion mask when the thyristor was fabricated or the film formed by thermal decomposition of monosilane $SiH_4$ or dislane $Si_2H_6$ after the silicon oxide film used as diffusion mask was etched away with hydrofluoric acid or hydrofluoric nitric acid may be used.

Figure 4A:
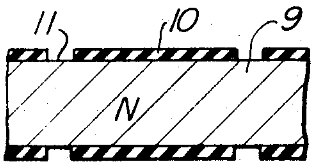
FIGS. 4*a* to 4*e* are process diagrams showing an example of the method of fabrication of a light-sensitive thyristor of this invention.
Figure 4B:
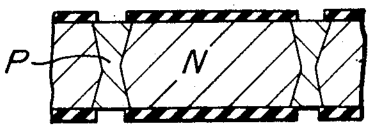
Figure 4C:
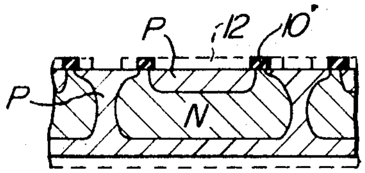
Figure 4D:
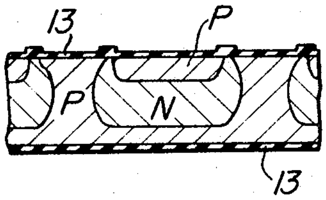
Figure 4E:
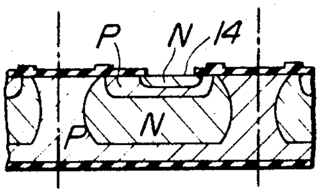

FIGS. 4*a* to 4*e* show an example of the method of making a light-sensitive thyristor of this invention. For example, an N type silicon wafer 9 is oxidized in an oxidation atmosphere to form a silicon oxide film 10 all over the surfaces of the silicon wafer. Then, a part of the silicon oxide film is removed by photoetching to form a ring formed exposed part 11 so that its size may correspond to the size of the light-sensitive thyristor. Boron is diffused from the exposed part 11 to form a P layer through the two surfaces of the wafer as shown in FIG. 4*b*. Then, the silicon oxide films at the bottom surface of the silicon wafer and in the center region of the part which later becomes a pellet is removed by photoetching to provide a window 12 and leave a ring form oxide film 10' as shown in FIG. 4*c*. The part shown by dotted lines shows the etched away silicon oxide film. Boron is again diffused from said exposed part to form a P layer. Then, as shown in FIG. 4*d*, the exposed silicon surface is oxidized to form a silicon oxide film 13. Subsequently, as shown in FIG. 4*e*, a part of the silicon oxide film on the P layer is removed by photoetching at the center of the pellet to provide a window 14 and phosphorus is diffused therefrom to form an N layer. Thus, a PNPN type silicon pellet assembly wherein the edges of the three PN junctions are exposed on one plane surface is obtained. The wafer is cut and separated by etching at the positions shown by dotted lines into separate pellets (light-sensitive thyristor).

Figure 3:
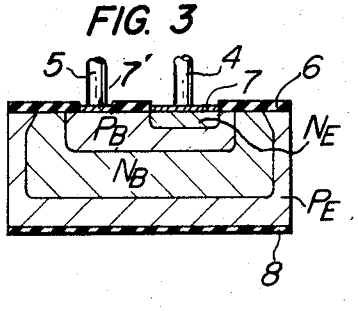
FIG. 3 is a cross-sectional diagram showing a structure of the light-sensitive thyristor according to another embodiment of this invention.

The light-sensitive thyristor shown in FIGS. 1 to 3 are formed by providing an anode, a cathode and a gate to said pellet. The width of the ring of the $P_B$ region (the width of the right-hand side of $N_E$) is about 70 μ, and the ring width of the $N_B$ region is also about 70 μ. It is preferable to make the ring width of $N_B$ larger than about 65 μ from the viewpoint of the breakdown voltage, but less than about 75 μ from the viewpoint of fabrication. These concrete values are given for the pellet of 1.78 mm square, and these values never restrict the scope of this invention.

The area of $N_E$ has conventionally been determined by considering the current capacity, the forward voltage drop etc. The area of $N_E$ determines the current flow in the on-state of the thyristor and it cannot be made so small as far as the current capacity is concerned. However, when the current capacity is not a serious requirement, it is possible to make $N_E$ quite small.

Figure 7B:
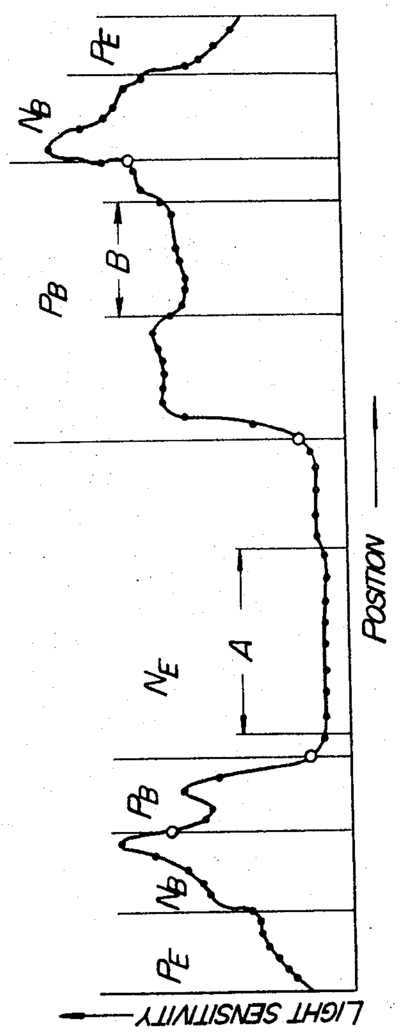
FIGS. 7*a* and 7*b* and FIGS. 8*a* and 8*b* are diagrams showing examples of light-sensitive thyristors of this invention and results of measurements of the light-sensitivity of respective positions on the irradiated surfaces of the light-sensitive thyristors.
Figure 7A:
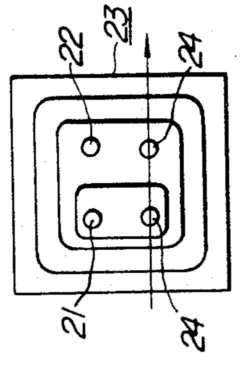

FIG. 7*b* shows a result of measurements of the light-sensitivity of the light-sensitive thyristor when the light-sensitive thyristor pellet 23 as shown in FIG. 7*a* is formed, wherein the cathode 21 and the gate 22 are provided thereto, part of the silicon oxide film on $N_E$ and $P_B$ is removed to expose the silicon surface and to form the exposed part 24 and the pellet is scanned with a light spot of 10 $\mu$ in diameter in the arrow direction. As is seen from this result, the light-sensitivity is lowered at the parts A and B where the silicon oxide films are removed. Accordingly, the silicon oxide film is useful as the film for preventing reflection.

Figures 8A, 8B:
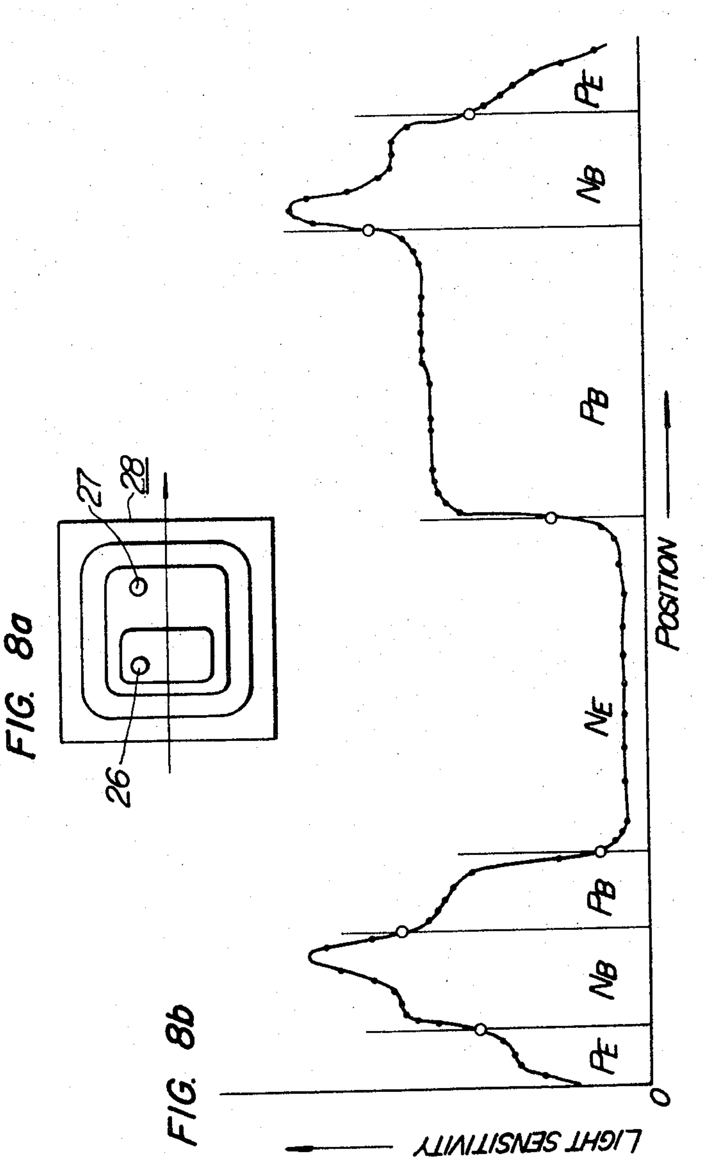

The curve shown in FIG. 8*b* indicates the light-sensitivity measured at each point when the light-sensitive thyristor 28 shown in FIG. 8*a* is formed and scanned with the light spot of 10 $\mu$ in diameter in the direction of the arrow. It will be understood that the light-sensitivity of $N_E$ or the junction $J_3$ between $N_E$ and $P_B$ is the lowest. Accordingly, $N_E$ or the junction $J_3$ not suitable for the area to be illuminated. On the other hand, the light-sensitivity of the junction $J_2$ between $P_B$ and $N_B$ is the highest and accordingly, it is appropriate to expose the edge of the junction $J_2$ at the area to be illuminated. Since the $N_B$ side of the $J_2$ junction is higher in light-sensitivity, it is more appropriate to expose $N_B$ at the area to be illuminated.

In conventional light-sensitive thyristors, the edge of the junction $J_2$ is not used as the area to be illuminated and accordingly, the enhancement of light-sensitivity cannot be expected. On the other hand, in the light thyristor according to this invention, the junction $J_2$ having a high light-sensitivity is exposed at the area to be illuminated and its light-sensitivity is quite high. The conventional non-planar type light-sensitive thyristors cannot be ignited if the light intensity is less than 3,000 – 5,000 lx. even if its form is changed in various ways, but it is verified that the light-sensitive thyristor of this invention can be ignited with light of only 1,000 lx, in intensity.

It will be understood from FIG. 8*b* and the foregoing explanation that $N_E$ is not suitable for the area to be illuminated, but the current capacity of the light-sensitive thyristor can be enhanced if substantially the entire surface $N_E$ is covered with a metal evaporation film to reduce the current density therein. An example is shown in FIG. 3. In the figure, the same reference numerals as appear in FIGS. 1 and 2 indicate the same components, but the evaporation film of Au, Au-Cu or Al adhered to $N_E$ covers the $N_E$ surface almost completely and the cathode is connected thereto. Accordingly, in this light-sensitive thyristor, it is possible to enhance light-sensitivity without the defect of an increase in current density in $N_E$ by making the area of the $N_E$ surface, which is not effective as a light-sensitive surface, small. Moreover, such structure is advantageous not only for electrical characteristics, but also for fabrication. This is, the mask used to remove the silicon oxide film on the $N_E$ surface can be used also from deposition, which contributes to an improvement in accuracy and cost reduction. The increase in accuracy means that the cathode connection position can be determined accurately and it becomes possible to obtain light-sensitive thyristors having small variance of characteristics.

Figure 6:
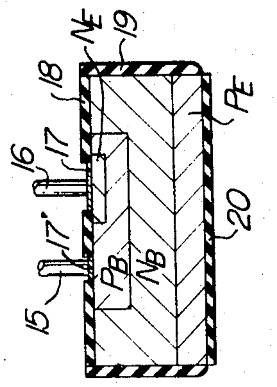
FIG. 6 is a cross-sectional diagram showing a structure of the light-sensitive thyristor according to a further embodiment of this invention.

Further, as is seen from FIG. 8*b*, the light-sensitivity of $P_E$ is not so high. Accordingly, it is not required to expose the edge of the junction $J_1$ between $P_E$ and $N_B$ on the upper surface. An example is shown in FIG. 6. In the figure, the cathode 16 is connected to the region $N_E$ through the metal evaporation film 17, the gate 15 is connected to $P_B$ through the metal evaporation film 17′ and the anode 20 is connected to $P_E$. The silicon oxide film 18 is formed on the junction edge $J_3$ between $N_E$ and $P_B$ and the junction edge $J_2$ between $P_B$ and $N_B$ and it functions as the film for preventing the reflection of incident light and the protection film for the junctions. The junction edge $J_1$ between $N_B$ and $P_E$ is exposed not at the upper surface of the silicon block, but at the side surface and the edge of junction $J_1$ is covered and protected with a passivation film 19. The light-sensitive thyristor having such a junction form has the merit in fabrication. Namely, the impurity diffusion process is reduced compared with the processes shown in FIG. 4. More concretely, a P type impurity is diffused into all the bottom surface of the N type silicon wafer, simultaneously with diffusion into the predetermined part of the upper surface through the window of the silicon oxide film and then an N type impurity is diffused into the P type layer in the upper surface to obtain the assembly of pellets having the configurations as shown in FIG. 6.

A measurement shows that the reflection between the minimum light intensity for ignition and *dv/dt* for the light-sensitive thyristors shown in FIGS. 1 and 2 was 0.5 V/$\mu$s at an illumination of 1,000 lx. On the other hand, for conventional non-planar type thyristors, it was 0.5 V/$\mu$s at 3,000 lx and for another conventional ones, it was 0.3 V/$\mu$s at 5,000 lx. It will be understood from the above results that the light thyristor of this invention has quite a high sensitivity.

As contrasted to ordinary thyristors ignited by a gate current, the light-sensitivity of the light-sensitive thyristor should be taken into consideration. According to the study of the present inventors, it was found that the ranges of 20 to 23 $\mu$, 20 to 22 $\mu$, 65 to 80 $\mu$ and 40 – 45 $\mu$ for the thicknesses of $N_E$, $P_B$, $N_B$ and $P_E$, respectively, are suitable for a PNPN type light-sensitive thyristor. As $N_E$ becomes thicker, the light-sensitivity increases, but the breakover voltage decreases. As $P_B$ becomes thinner, the light-sensitivity increases, but the breakover voltage decreases. Since the light-sensitive thyristor of this invention does not use $N_E$ as the light-sensitive area, $N_E$ is preferably thicker, but it is necessary to select a suitable value considering the breakover voltage. The ranges described hereinabove are chosen in this way. In this range, the light-sensitive thyristor can be ignited with a light intensity of about 1,000 lx. Since $N_B$ determines the reverse blocking voltage of the light-sensitive thyristor, a larger thickness is preferable, but then the forward voltage drop increases. Taking these conditions into consideration, the above range of $N_B$ was determined. It is particularly suitable that the thicknesses of $N_E$, $P_B$, $N_B$ and $P_E$ are about 22μ, about 21μ, about 75μ and 43μ, respectively. The blocking voltage of the light-sensitive thyristor made by the present method is 300 – 350 V and it is comparable to that of conventional light-sensitive thyristors. The voltage drop in on-state can be reduced by providing an electrode over the entire surface of $N_E$ to decrease the current capacity in $N_E$.

Figure 5:
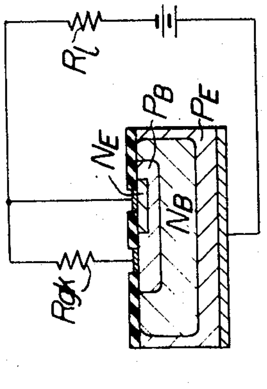
FIG. 5 is an electrical connection diagram of the light-sensitive thyristor according to this invention.

As has been described hereinabove, though the light-sensitive thyristor of this invention is excellent in light-sensitivity and ignition characteristics, a suitable resistor $R_{gk}$ must be inserted between the gate and the cathode to enhance the operational stability. FIG. 5 shows a practical connection diagram of the light-sensitive thyristor, wherein $R_{gk}$ is inserted between the gate and the cathode. As some part of the anode current flows out the gate to $R_{gk}$ without passing through the $N_E$ region, the transport efficiency $\alpha_2$ may be regulated with $R_{gk}$. For a smaller value of $R_{gk}$, the light-sensitivity is also smaller, but the operational stability is higher and the thyristor can be used under a higher *dv/dt* condition. The light-sensitive thyristor of this invention has a higher light-sensitivity for smaller $R_{gk}$ than that for the conventional light-sensitive thyristor, because the light-sensitive thyristor of this invention has intrinsically high light-sensitivity. These are advantages of the light-sensitivity thyristor of this invention unachieved by conventional thyristors, wherein the light-sensitivity of the junction is low, $R_{gk}$ cannot be made small and the operational stability is affected under a circuit condition where *dv/dt* is high.

The excellent properties of the light-sensitive thyristor of this invention will be better understood from the fact that the variance in the turn-on times of the light-sensitive thyristors is 1 μs or less. However, it is practically necessary to determine the ratio between the areas of $N_E$ and $N_B + P_B$ from the viewpoints of the current capacity and light-sensitivity which are important for light-sensitive thyristors. For example, if the light-sensitivity is sacrificed, it is possible to increase the ratio of the area of $N_E$ to that of $N_B + P_B$ to about 80 percent. On the other hand, if the current capacity is completely sacrificed, it is possible to reduce the ratio of the area of $N_E$ to that of $N_B + P_B$ to about 2.2 percent. In this case, however, the current density in $N_E$ increases, the temperature of the light-sensitive thyristor increases, the voltage drop in on-state increases and thus its use becomes impossible. The ratio of the area $N_E$ to that of $N_B + P_B$ is determined by the usage conditions of the light-sensitive thyristor. For example, when the light-sensitive thyristor is used to give the gate signal to the main thyristor in the high voltage DC transmission system, the ratio of the area of $N_E$ to that of $N_B + P_B$ of about 10 – 25 percent is suitable. However, in some applications even if the ratio is reduced to less than about 10 percent in some applications, the device can be used if the metal evaporation film is formed on $N_E$ as explained with reference to FIG. 3 to reduce the current density in $N_E$. Further, the light-sensitive thyristor of this invention has a light-sensitivity more than twice larger than that of conventional light-sensitive thyristors. By such construction, a light-sensitive thyristor of a large current capacity can be obtained. According to the study of the present inventors, a light-sensitive thyristor whether the current capacity and the light-sensitivity are best balanced and which has excellent properties can be obtained if the area of $N_E$ is made about 10 – 25 percent of that of $N_B + P_B$. This invention resides in that the junction between $N_B$ and $P_B$ is used as a light receiving plane and the area of $N_E$ is determined in an optimum range. The device of this invention is essentially different from the conventional light-sensitive thyristor wherein the ignition-sensitivity (operation characteristics) $N_E$ in that the current density in $N_E$ is made smaller in this invention.

The position at which the gate and cathode were provided also studied by the present inventors. It was found that light-sensitivity of the thyristor to light is higher when they are provided at the central portions of the respective regions than when they are provided at parts offset therefrom, as shown in FIG. 1.

Figure 9:
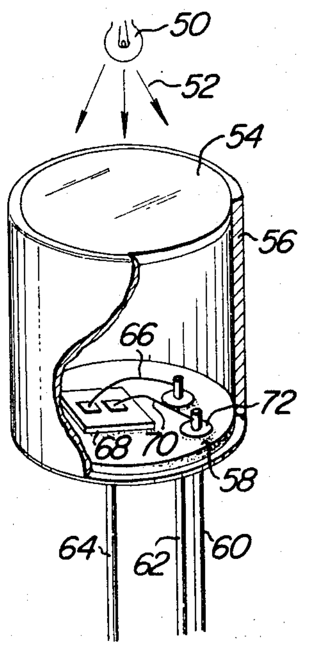
FIG. 9 is a partially broken-away perspective view of a light-sensitive thyristor device according to this invention.

In FIG. 9, the light-sensitive thyristor according to the present invention comprises a wafer 68 embodying the present invention which is soldered to a metallic base 58, an emitter lead 60 connected to an emitter wire 70, a gate lead 62 connected to a gate wire 66, a base lead 64 connected to the base 58, and a cylindrical case 56 having a glass window 54 directed to a light source 50. The leads 60 are projected through ceramic insulator 72.

The semiconductor wafer 68 is completely isolated from an atmosphere by the case member 56 and the metallic base 58. A gate resistor (not shown) is connected between the leads 60 and 62 outside of the device.

The light-sensitive device according to the present invention is turned on when the wafer 68 is irradiated by light beam 52 having a light capacity enough to turn on the device.

The features of the light-sensitive thyristor of this invention summarized as follows.

(1) Variance of operational characteristics can be reduced. This is particularly profitable when, for example, light-sensitive thyristors connected to gates of large power thyristors in series connection are triggered by a light pulse and the large power thyristors are ignited at the same time.

(2) Since the positions where the gate, the cathode and the lead are set can be determined accurately, the variance of the characteristics becomes quite small and the variance of $R_{gk}$ to be connected becomes also small.

(3) Since the junction ends and all the surfaces are covered with a silicon oxide film which is an excellent protection film, the change of surface leakage or surface recombination hardly occurs.

(4) Since the light-sensitive junction edges are exposed at the light receiving surface, it is possible to transmit light to the neighborhood of the junction $J_2$ to enhance light-sensitivity. Since this light-sensitivity can be obtained without regulating the current transport efficiency $\alpha$ as in conventional thyristors, the *dv/dt* characteristic need not be made small.

(5) The $SiO_2$ film on the surface functions a reflection preventing film and hence contributes to an increase in light-sensitivity.

(6) The light-sensitive thyristor having balanced characteristics can be obtained without sacrificing light-sensitivity and current capacity.

The reason why the light-sensitive thyristor according to the present invention has a high light-sensitivity is based upon the fact that an edge of an PN junction formed by a pair of inner regions one adjoining an outer emitter region (first region) and other adjoining another outer emitter region (fourth region) is exposed to one plane where light is irradiated and that the area ratio of the first region to the sum of the second and third regions is limited to 10 to 25 percent, i.e., the area of the second and third regions exposed to one plane surface to be irradiated is made large enough to obtain the high light-sensitivity.

In the conventional planar type thyristors which are turned on by a gate current, the area of the first region (emitter region) should be at least about 30 percent, or the current capacity of the thyristors must be limited to a very low level. The light-sensitive thyristor according to the present invention can be substantially distinguished from the gate-current-turn-on thyristors by the difference in the areas of the emitter regions.

The foregoing description relates to a part of the embodiments of this invention and the scope of this invention is by no means restricted thereto. It will be evident that various modifications and applications can be made without departing from the spirit of this invention and the scope of the appended claims.

We claim

1. In a light-sensitive thyristor comprising:

a semiconductor wafer, having a light receiving plane, and consisting of first, second, third and fourth successive adjacent regions, each having a conductivity opposite to that of an adjacent region;

a metallic base member for electro-conductively supporting said wafer;

a pair of leads, each being electro-conductively connected to said first region and said second region, and a lead being electro-conductively connected to said fourth region; and a case member isolating said wafer from the atmosphere and having a transparent window through which an ignition light signal is projected by a light source onto the light receiving plane of said wafer, so as to turn on the thyristor;

the improvement wherein:

at least said second and third regions of said semiconductor wafer are co-planar with the outer surface of said first region forming said light receiving plane, at least the two junctions between said first and second regions and between said second and third regions extend to said light receiving plane, and the area of the surface of said first region is about 10 to 25 percent of the total area of the surfaces of said second and third regions exposed at said light receiving plane.

2. The improvement in a light-sensitive thyristor according to claim 1, wherein a free surface of said light receiving plane is coated with a film for preventing light scattering.

3. The improvement in a light-sensitive thyristor according to claim 1, wherein a surface of said first region is coated with a metallic film to which said lead to be connected to said first region is connected.

4. In a light-sensitive thyristor comprising:

a semiconductor wafer, having a light receiving plane, and consisting of first, second, third and fourth successive adjacent regions, each having a conductivity opposite to that of an adjacent region, thereby forming a first junction between said first and second regions, a second junction between said second and third regions, and a third junction between said third and fourth regions;

a metallic base member for electro-conductively supporting said wafer;

a pair of leads, each being electro-conductively connected to said first region and said second region, and a lead being electro-conductively connected to said fourth region; and a case member isolating said wafer from the atmosphere and having a transparent window through which an ignition light signal is projected by a light source onto the light receiving plane of said wafer, so as to turn on the thyristor;

the improvement wherein:

each edge of said junctions extends to the light receiving plane and the area defined by the edge of the first junction is about 10–25 percent of the total area defined by edges of said second and third junctions.

5. In a light sensitive thyristor device comprising:

a light source for directing a beam of light onto a surface of a semiconductor wafer;

a semiconductor wafer having a light receiving plane, and consisting of first, second, third and fourth successive regions, each region having a conductivity opposite to that of an adjacent region, forming a first junction between said first and second regions, a second junction between said second and third regions, and a third junction between said third and fourth regions in the wafer;

a metallic base member for electro-conductively supporting said wafer;

a pair of leads each being electro-conductively connected to said first region and said second region, and a lead being electro-conductively connected to said fourth region; and a case member isolating said wafer from the atmosphere and having a transparent window through which said light beam is projected by said light source to said light receiving plane;

the improvement wherein:

each edge of said junctions extends to said light receiving plane, and the area defined by the edge of said first junction is about 10 to 25 percent of the total area defined by the edges of said second and third junctions.

6. In a light-sensitive thyristor comprising:

a semiconductor wafer including means, responsive to the impingement of light thereon, for triggering a current conductivity path through said semiconductor wafer, said means comprising a predetermined portion of a light receiving plane of said wafer, said wafer consisting of first, second, third and fourth successive adjacent regions, each having a conductivity opposite to that of an adjacent region;

a metallic base member for electro-conductively supporting said wafer;

a pair of leads, each being electro-conductively connected to said first region and said second region, and a lead being electro-conductively connected to said fourth region; and a case member isolating said wafer from the atmosphere and having a transparent window through which an ignition light signal is projected by a light source onto said predetermined portion of the light receiving plane of said wafer, so as to turn-on said thyristor by the provision of said current conducting path through said wafer;

the improvement wherein:

at least said second and third regions of said semiconductor wafer are co-planar with the outer surface of said first region forming said predetermined portion of the light receiving plane of said wafer, onto which light for triggering said thyristor is to be directed, at least the two junctions between said first and second regions and between said second and third regions extend to said predetermined portion of the light receiving plane, and the area of the surface of said first region is about 10 to 25 percent of the total area of the surfaces of said second and third regions exposed in said predetermined portion of said light receiving plane.

7. The improvement in a light-sensitive thyristor according to claim 6, wherein a free surface of said light receiving plane is coated with a film for preventing light scattering.

8. The improvement in a light-sensitive thyristor according to claim 6, wherein a surface of said first region is coated with a metallic film to which said lead to be connected to said first region is connected.

9. The improvement in a light-sensitive thyristor according to claim 7, wherein a surface of said first region is coated with a metallic film to which said lead to be connected to said first region is connected.

10. The improvement in a light-sensitive thyristor according to claim 6, wherein edge of said junctions extends to the light receiving plane.

* * * * *